United States Patent [19]
Belcher et al.

[11] Patent Number: 5,607,600
[45] Date of Patent: Mar. 4, 1997

[54] OPTICAL COAT RETICULATION POST HYBRIDIZATION

[75] Inventors: James F. Belcher, Plano; Craig Osborn, Garland, both of Tex.

[73] Assignee: Texas Instruments Incorporated, Dallas, Tex.

[21] Appl. No.: 381,677

[22] Filed: Jan. 31, 1995

[51] Int. Cl.⁶ .............................. B44C 1/22; C03C 15/00
[52] U.S. Cl. .................... 216/24; 216/17; 216/76
[58] Field of Search .................. 216/17, 24, 75, 216/76, 100, 101, 41, 67, 2; 156/633.1, 648.1, 649.1, 655.1; 437/3; 250/338.3; 257/79–82

[56] References Cited

U.S. PATENT DOCUMENTS

| | | | |
|---|---|---|---|
| 4,080,532 | 3/1978 | Hopper | 250/332 |
| 4,740,700 | 4/1988 | Shaham et al. | 437/3 X |
| 4,745,278 | 5/1988 | Hanson | 250/338.2 |
| 4,792,681 | 12/1988 | Hanson | 250/338.2 |

*Primary Examiner*—William Powell
*Attorney, Agent, or Firm*—Kay Houston; James W. Brady; Richard L. Donaldson

[57] ABSTRACT

An infrared sensing array 46 is coupled to a sensing integrated circuit structure 48, and then inter-pixel thermal isolation slots 62 are etched in the optical coating 32 of the infrared sensing array 46. An optional protective material 64 may be deposited over at least the sensing integrated circuit structure 48 for additional protection.

23 Claims, 5 Drawing Sheets

OPTICAL COAT RETICULATION POST HYBRIDIZATION

CROSS-REFERENCE TO RELATED APPLICATIONS

The following U.S. patent applications are commonly assigned and are hereby incorporated herein by reference:

| TI Case | Ser. No. | Filing Date | Inventor | Title |
| --- | --- | --- | --- | --- |
| TI-18788 (U.S. Pat. No. 5,426,304) | 08/182,865 | 1/13/94 | Belcher et. al. | Infrared Detector and Method |
| TI-17233 (U.S. Pat. No. 5,436,450) | 08/182,268 | 1/13/94 | Belcher et al. | Infrared Detector and Method |
| TI-18636 (U.S. Pat. No. 5,424,544) | 08/235,835 | 4/29/94 | Shelton et al. | Inter-Pixel Thermal Isolation for Hybrid Thermal Detectors |
| TI-18727 (Abandoned) | 08/223,088 | 4/4/94 | Belcher et al. | Dual Etching of Ceramic Materials with an Elevated Thin Film |
| TI-18736 (Abandoned) | 08/222,769 | 4/4/94 | Belcher et al. | Dual Etching of Ceramic Materials with a Thin Front Film |
| TI-18737 (U.S. Pat. No. 5,466,331) | 08/222,144 | 4/4/94 | Belcher | An Elevated Thin Film for Ceramic Materials |
| TI-18726 (Abandoned) | 08/223,073 | 4/4/94 | Belcher et al. | Etching of Ceramic Materials with an Elevated Thin Film |

The following U.S. patent applications filed concurrently herewith the patent application for the present invention are also incorporated herein by reference:

| TI Case | Ser. No. | Inventor | Filing Date | Title |
| --- | --- | --- | --- | --- |
| TI 19300 | 08/381,676 | Owen et al. | 1/31/95 | Thermal Crosstalk Reduction for Infrared Detectors with Common Electrodes |
| TI 18945 (U.S. Pat. No. 5,521,104) | 08/381,693 | Walker | 1/31/95 | A Method for Dry Etching of Post-processing Interconnection Metal on Hybrid Integrated Circuits |

1. Field of the Invention

This invention generally relates to infrared or thermal imaging systems, and more specifically to inter-pixel thermal isolation in a thermal (infrared) detector array.

2. Background of the Invention

Infrared or thermal imaging systems typically use thermal sensors to detect infrared radiation and produce an image capable of being visualized by the human eye. Some examples of such thermal imaging devices include night vision equipment and law enforcement surveillance equipment.

Several prior art references disclose infrared imaging arrays and methods for producing such arrays. U.S. Pat. Nos. 4,080,532 issued to Hopper; and 4,745,278 and 4,792,681 issued to Hanson utilize ferroelectric materials for infrared detection. Thermal imaging by means of uncooled sensors is described in a paper entitled *Low-cost Uncooled Focal Plane Array Technology* written by Hanson, Beratan, Owen and Sweetser presented Aug. 17, 1993 at the IRIS Detector Specialty Review.

SUMMARY OF THE INVENTION

In accordance with the present invention, the disadvantages and problems associated with thermal coupling between adjoining thermal sensors of an infrared sensing array have been reduced. The present invention improves inter-pixel thermal isolation by selectively patterning slots in the optical coating and any underlying common electrode after the infrared imaging array, or infrared sensing array, has been bonded to the associated sensing integrated circuit to form a hybrid structure.

A first embodiment is a method for fabricating a hybrid thermal detector structure, comprising the steps of forming an infrared sensing array, forming a sensing integrated circuit structure, coupling the backside contacts of the infrared sensing array to the contact metal of the sensing integrated circuit structure, and then etching the optical coating of the infrared sensing array to form thermal isolation slots in the optical coating. The infrared sensing array is comprised of at least three thermally sensitive pixels, backside contacts abutting a first side of the pixels, and an optical coating in contact with a second side of the pixels, wherein the optical coating is comprised of an electrically-conducting coat. The sensing integrated circuit structure is comprised of integrated circuitry, a thermal isolation structure mounted on the integrated circuitry, contact metal electrically connecting the integrated circuitry to a top region of the thermal isolation structure, and a protective coating deposited over at least the integrated circuitry and the thermal isolation structure. The etching step is performed after the coupling step.

A second embodiment includes the steps of the first embodiment with the addition of a protective coating deposited over at least the integrated circuitry.

third embodiment comprises the steps of the second embodiment, where the protective coating is deposited over the integrated circuitry, and the thermal isolation structures are formed on the protective coating.

Advantages of the invention include reducing the possibility of array breakage when forming thermal isolation slots in the optical coating or in subsequent processing, by producing a more rigid, multilayer structure prior to etching the slots in the fragile infrared imaging array. The optical coating is thin and fragile, and etching the optical coat after hybridization minimizes breakage since there is more mechanical support from the structure during the etching process from the hybrid structure after it has been bonded. The feature of the protective material in the second and third embodiments is a further advantage, because the sensing integrated circuit structure is protected by the protective material during the etching of the optical coating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

Figure 1:
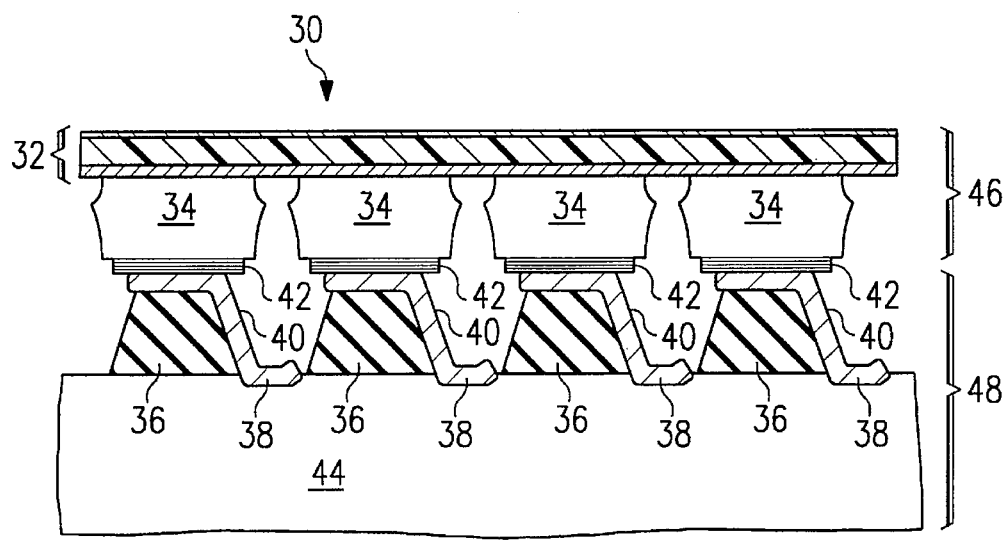
FIG. 1 illustrates the generic concept of a hybrid structure of the prior art consisting of a planar infrared sensing array electrically and physically bonded to thermally isolating mesas on a sensing integrated circuit.

The drawings are neither to absolute nor relative scale. Thin film thicknesses have been exaggerated for clarity in description.

DETAILED DESCRIPTION OF THE PREFERRED EMBODIMENTS

Thermal imaging systems described in prior an references utilize an array of ferroelectric or bolometric sensors to detect thermal images which may then be converted into a TV image. Each pixel in these arrays comprises a capacitor that has a temperature-sensitive (particularly to infrared wavelength radiation) dielectric. Since the charge stored by a capacitor is proportional to the product of its terminal voltage and capacitance, electronic circuitry may be attached to the two terminals of the pixel capacitor to measure the intensity of the infrared radiation impinging on a specific pixel. Obstructions in the imaging field are removed and electronic connections to these capacitors are simplified if one of these capacitor terminals is common to all. From hundreds to tens of thousands of connections are made between the other isolated terminals of the capacitors and the integrated circuit used for electronic sensing. In addition, the pixel capacitors are thermally isolated from each other while having one terminal electrically connected to all the other common terminals.

The common connection, or common electrode, to one side of the pixel capacitors may be part of an optical coating comprised of a plurality of thin films having the desired physical properties, such as infrared transparency, electrical conductivity, and thermal conductivity, for example. The infrared energy is absorbed by the optical coating and is transferred to the pixels which may be made, for example, of barium-strontium-titanate (BST). The electrical polarization and capacitance of a pyroelectric material such as BST changes in response to thermal radiation.

Typically, an infrared absorber and common electrode assembly are disposed on one side the pyroelectric element and comprise an optical coating disposed over a common electrode. A sensor signal electrode may be disposed on the opposite side of each pyroelectric element. The infrared absorber and common electrode assembly typically extend across the surface of the focal plane array and electrically couple each pyroelectric element through the common electrode. Each infrared detector element or thermal sensor is defined, in part, by a portion of the infrared absorber and a common electrode assembly and a respective sensor signal electrode, which constitute capacitive plates, and a pyroelectric element, which constitutes a dielectric or insulator disposed between the capacitive plates.

To maximize thermal response and enhance thermal image accuracy, each pyroelectric element of a focal plane array is preferably isolated thermally from adjoining pyroelectric elements so that the sensor signal accurately represents incident infrared radiation associated with each thermal sensor. Thermal isolation between thermal sensors, known as inter-pixel thermal isolation, improves the accuracy and quality of the resulting thermal image. Several approaches have been used to improve inter-pixel thermal isolation in a focal plane array. Unfortunately, the optical coating which provides absorption of the infrared energy also forms a thermal path between pixels, producing thermal crosstalk which may degrade the focus of the resultant image produced. Improving thermal isolation between pixel capacitors by patterning slots in the horizontal and vertical directions of the optical coating while leaving the common electrode intact is described in commonly assigned and related U.S. Pat. No. 5,424,544 Application Inter-Pixel Thermal Isolation for Hybrid Thermal Detectors, Ser. No. 08/235,835 filed Apr. 29, 1994, U.S. Pat. No. 5,424,544. Patterning elongated parallel slots through the entire optical coating is described in U.S. patent application, Ser. No. 08/381,676 (TI case No. TI-19300) entitled Thermal Crosstalk Reduction for Infrared Detectors with Common Electrodes, filed concurrently herewith. However, it is possible for breakage of the optical coating and common electrode to occur while forming these slots. The present invention decreases the likelihood of breakage occurring while forming the thermal isolation slots, by forming the slots after hybridization (e.g. after attaching the infrared sensing array to the sensing integrated circuit structure).

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Table 1 below provides an overview of the elements of the embodiments and the drawings. The present invention and its advantages are best understood by referring to FIGS. 2–7 and Table 1 with like numbers being used for like and corresponding parts in the drawings.

TABLE 1

| Drawing Element | Generic Term | Preferred or Specific Examples | Other Alternate Examples or Descriptions |
| --- | --- | --- | --- |
| 30 | Hybrid Structure | | Hybrid device; hybrid system |

TABLE 1-continued

| Drawing Element | Generic Term | Preferred or Specific Examples | Other Alternate Examples or Descriptions |
|---|---|---|---|
| 32 | Optical coating | Multilayered | |
| 34 | Pixels | Barium-strontium-titanate | Thermally sensitive dielectric; pixel dielectric |
| 36 | Thermal isolation mesas | Photosensitive polyimide, Dupont 2734 | PMMA |
| 38 | Integrated circuit via for sensing circuit | | |
| 40 | Contact metal | Alloys such as TiW—Au. | |
| 42 | Infrared pixel backside contact | Alloys such as TiW—Au. | 4 layer composite of: In 15–60 μm Au 0.5–1.5 μm NiCr 0.5–1.5 μm TiW 0.2–1.0 μm |
| 44 | Integrated circuitry | Silicon technology | GaAs |
| 46 | Infrared sensing array | Optical Coating 32, Pixels 34, Backside contact 42 | Infrared imaging array |
| 48 | Sensing integrated circuit structure | Mesas 36, contact metal 40, integrated circuitry 44 | |
| 50 | Photoresist | Etch mask | (4–6 μm); 4620; other organic or inorganic compounds. 25–100 Å |
| 52 | Infrared transparent layer of 32. | NiCr (50 Å) | |
| 54 | ¼ wavelength separator layer of 32. | Parylene (1.4 μm) | ¼ wavelength at desired infrared signal; polyimide 500–2000 Å; common electrode; cermet; other metals such as Ti/W |
| 56 | Electrical conducting layer of 32. | NiCr (1000 Å) | |
| 60 | Bonding eutectic | Indium alloy | |
| 62 | Thermal isolation slots | Width = 1–2 μm | |
| 64 | Protective Material | Photoresist | Parylene, PMMA, PIRL, polyimide or combinations thereof; other easily dissolved materials; protective oxide; silicon dioxide; silicon nitride; protective overcoat. |

While many different geometries and configurations have been described in the references, FIG. 1 shows a prior an drawing of a generic hybrid structure 30 comprised of an infrared sensing array 46 electrically and physically bonded to a sensing integrated circuit structure 48. Although the pixels 34 have been thermally isolated from their neighbors, thermal crosstalk may still result via thermal conduction through the optical coating 32. To thermally isolate the integrated circuitry 44 from the pixels 34, thermal isolation mesas 36 have been mounted to the integrated circuitry 44. The electrical and physical mounting of infrared sensing array 46 to sensing integrated circuit structure 48 is achieved by the use of a bonding eutectic 60 (shown in later figures) to adhere the infrared backside pixel contacts 42 with the contact metal 40 through the vias 38.

Figure 2:
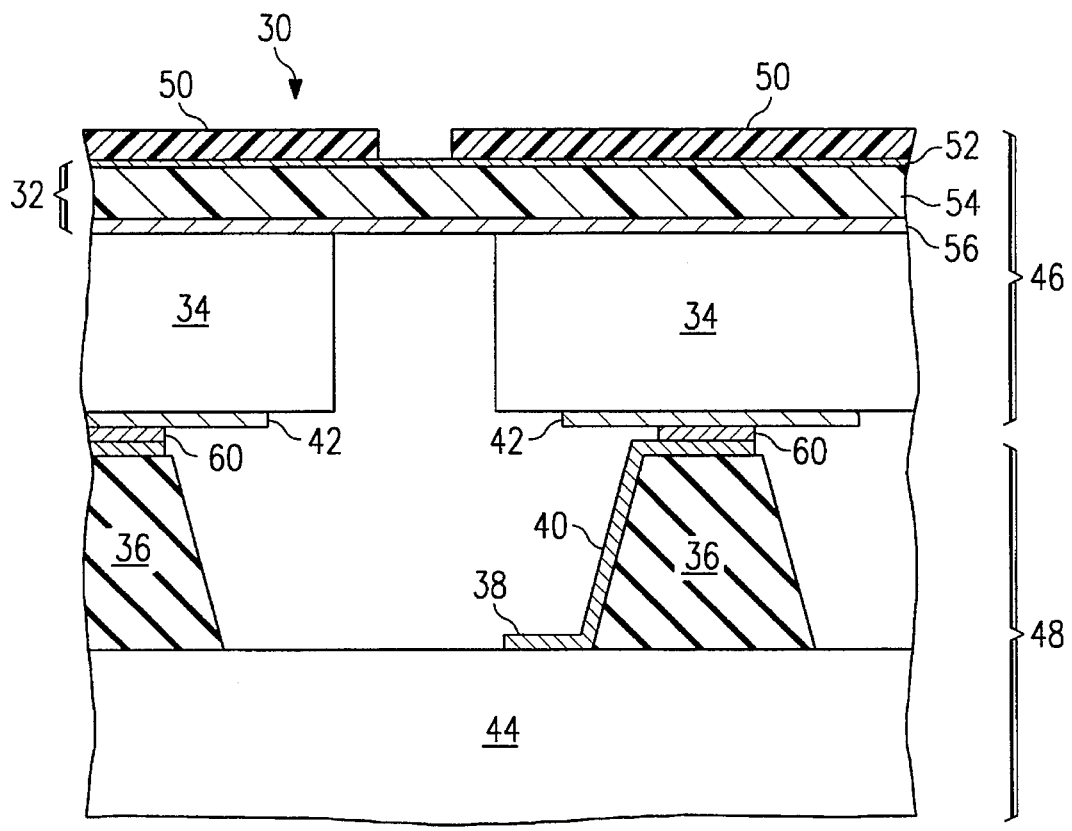
FIG. 2 shows a cross section of a portion of the hybrid structure with photoresist applied for the patterning of thermal isolation slots in the optical coating of the infrared sensing array.
Figure 3:
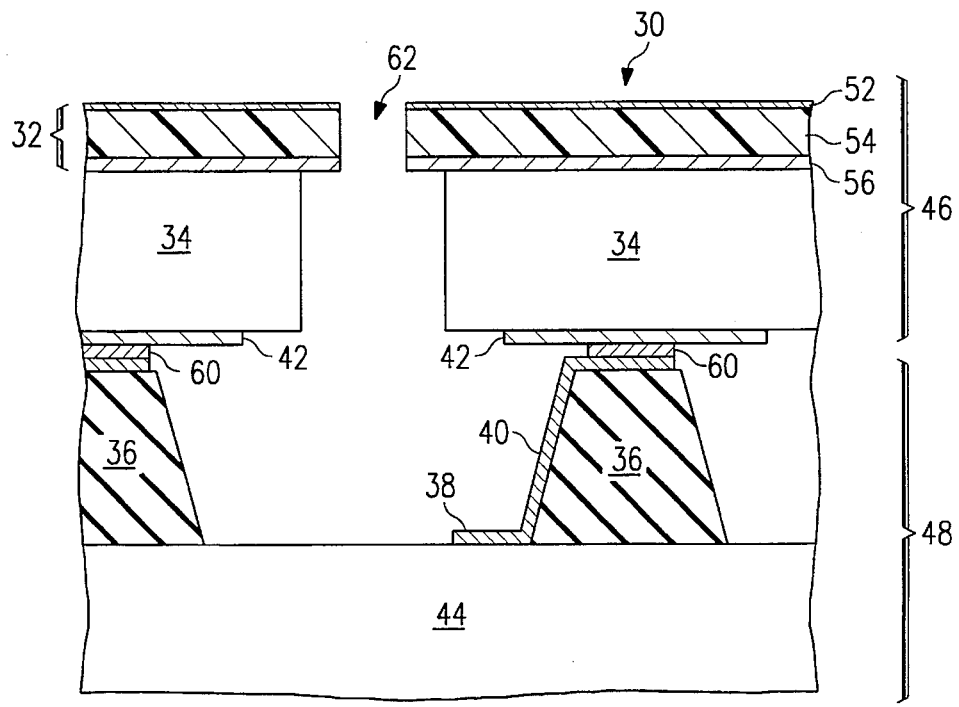
FIG. 3 shows a cross section of a portion of the hybrid structure after etching of thermal isolation slots and stripping of the photoresist.
Figure 4:
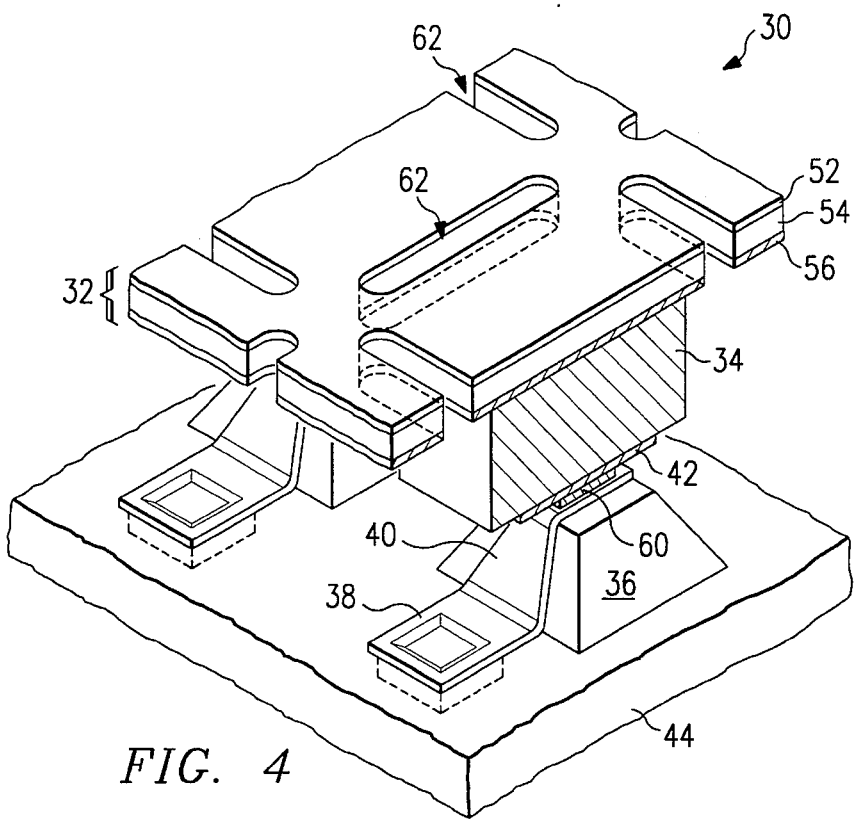
FIG. 4 is an isometric sketch showing the generic location of thermal isolation slots with respect to the hybrid structure.

A first embodiment of the present invention is shown in FIGS. 2–4. FIG. 2 shows in more detail the hybrid structure 30 which is similar to that of FIG. 1. The optical coating 32 is comprised of an infrared transparent layer 52, a ¼ wavelength filter material 54 and an electrical conducting layer 56. After the infrared sensing array 46 and sensing integrated circuit structure 48 have been coupled with bonding eutectic 60 (e.g. attached by bump bonding), a photoresist 50 is applied to the optical coating 32. The hybrid structure 30 consisting of infrared sensing array 46 and sensing integrated circuit structure 48 is a rigid, multilayer structure such that photoresist 50 may be applied by conventional spinning and then exposed and developed with solvent without deleterious effects to the hybrid structure 30. For example, the photoresist 50 may be a positive photoresist such as 4620 spun on for 20 seconds at 3000 rpm. After the resist is exposed and developed, suitable etchants, such as plasma, reactive ion gases, broadcast ion milling, or combinations thereof, may be used to selectively remove the optical coating 32 in regions not covered by resist, leaving thermal isolation slots 62. Preferably, the infrared transparent layer 52 and ¼ wavelength filter material 54 are plasma etched, and electrical conducting layer 56 is ion milled. The 1–2 micrometer (μm) width thermal isolation slots 62 are etched and the photoresist 50 is stripped, resulting in the structure of FIG. 3 and FIG. 4, for example. The thermal isolation slots 62 have been formed in the optical coating 32 to reduce thermal coupling between adjacent pixels 34. FIG. 4 shows an isometric view of a pixel portion of the hybrid structure 30 for more clarity. The slots 62 preferably extend 80% of the length of a pixel 34 edge.

Figure 5:
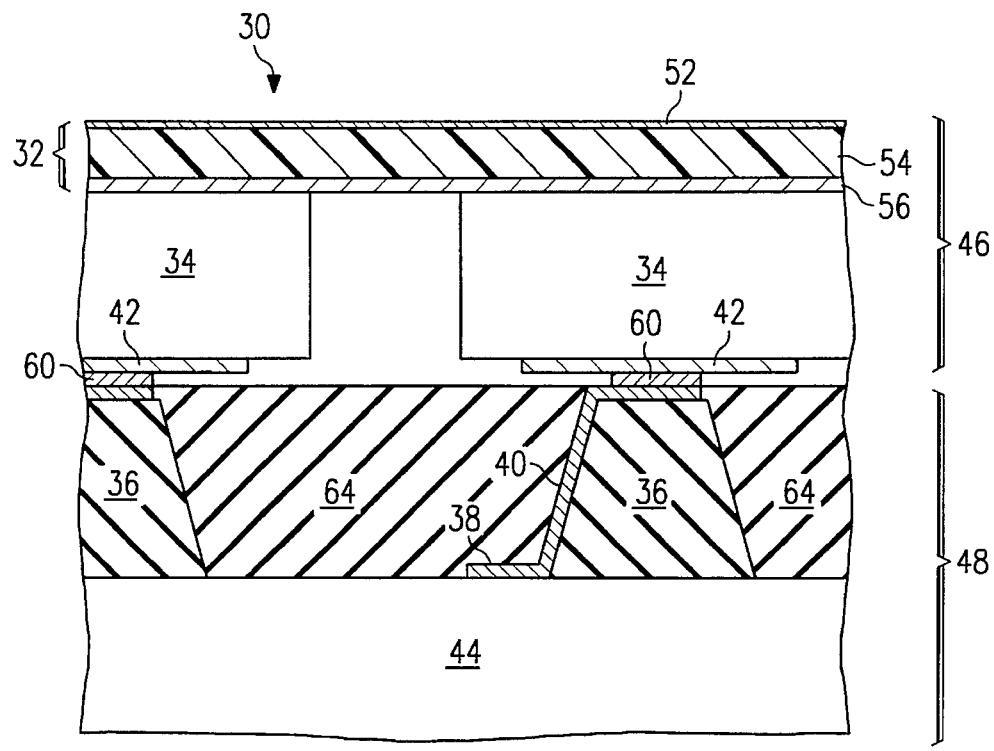
FIG. 5 shows a cross section of a portion of the hybrid structure with a protective coating applied over the sensing integrated circuit structure.
Figure 6:
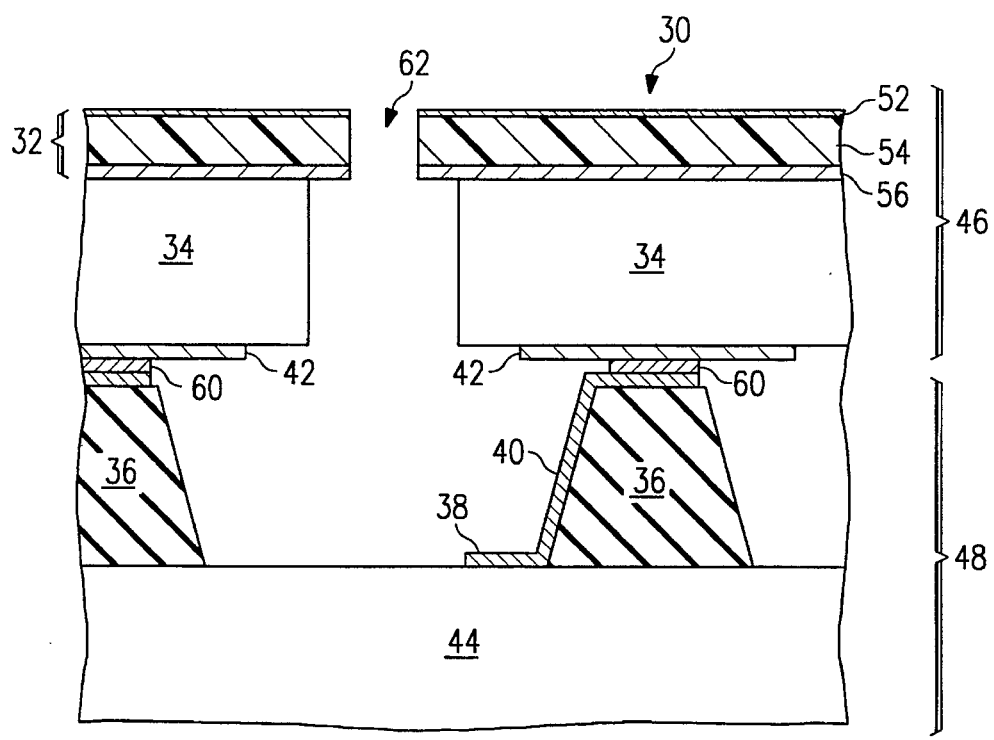
FIG. 6 shows the cross section shown in FIG. 5 after the protective coating has been removed and thermal isolation sloths have been etched.
Figure 7:
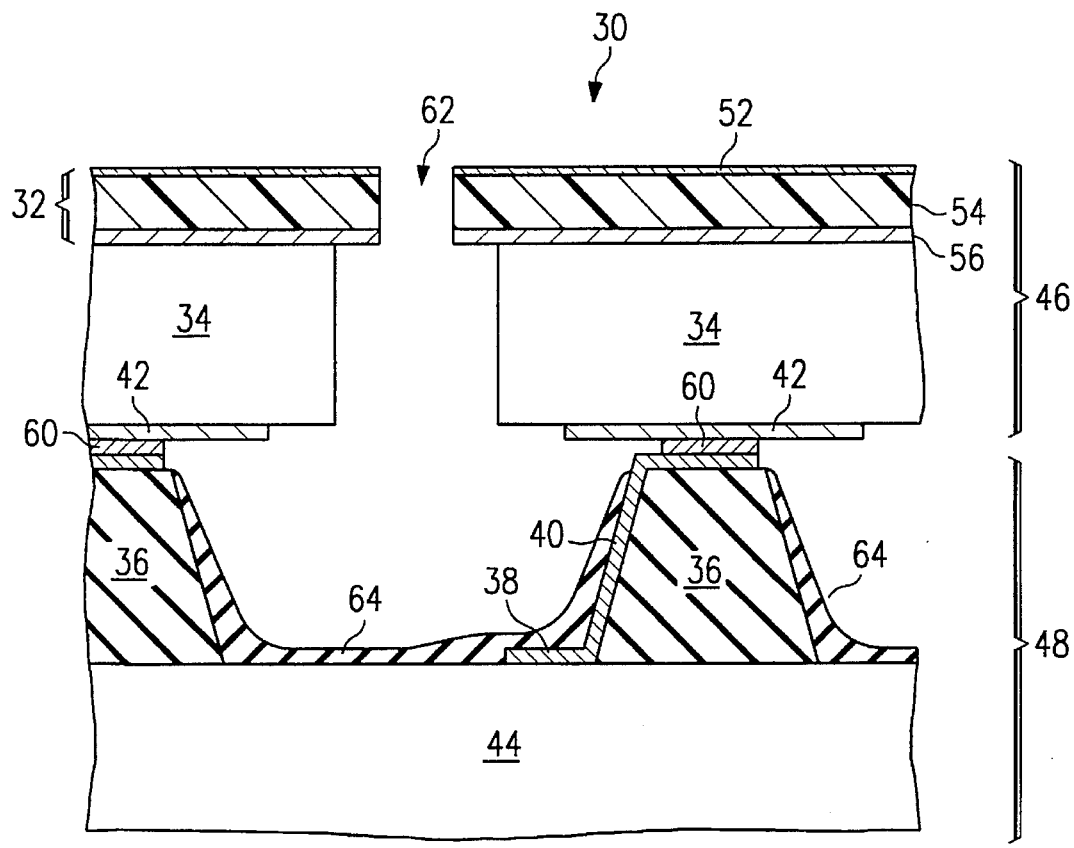
FIG. 7 shows the cross section shown in FIG. 5 where part of the protective coating remains on the structure.

A second embodiment of the present invention is shown in FIGS. 5–7. A protective material 64 may be, for example, spun onto the surface of the integrated circuit sensing circuit 48 prior to bonding infrared sensing array 46 and sensing integrated circuit structure 48 together, as shown in FIG. 5. The protective material 64 is preferably an organic coating comprising photoresist and PIRL (polyimide release layer). After the thermal isolation slots 62 have been etched, the protective material 64 may be removed, for example, as a gas by ashing in a plasma reactor. Preferably, the protective material 64 is removed entirely, as shown in FIG. 6.

However, since many organic protective materials are suitably inert, part of the protective material 64 may be left on the circuitry, as shown in FIG. 7. In this case, the amount of protective material 64 that remains on the structure is preferably minimized in order to maximize thermal isolation. This embodiment proves useful in the case where the chosen optical coating etchant may possibly cause damage to the underlying integrated circuit materials of the hybrid structure. Damage to the underlying integrated circuit may be prevented or minimized by the use of the protective material 64.

Figure 8:
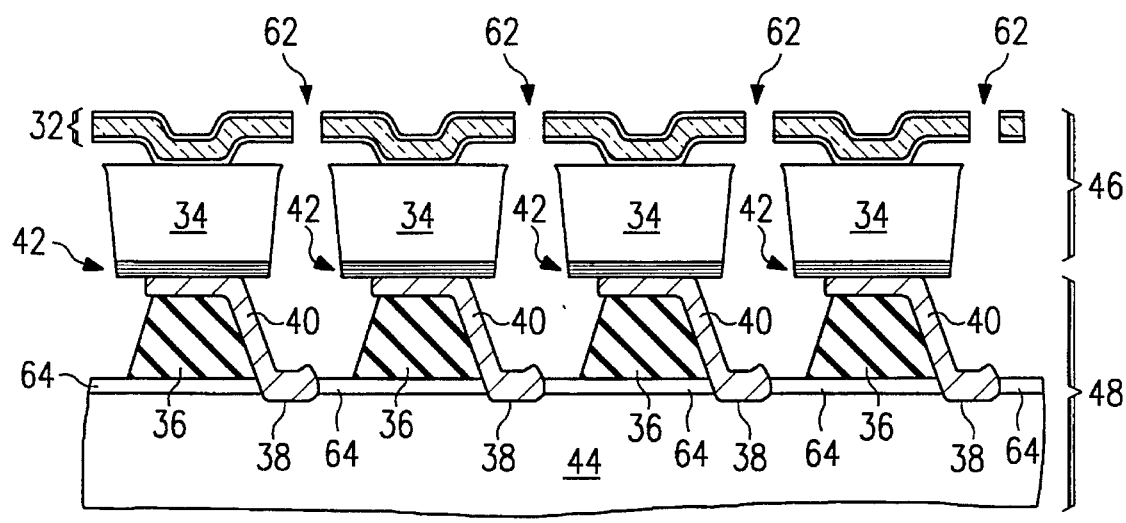
FIG. 8 shows an embodiment of the present invention in which the protective material is deposited over the integrated circuitry, and the thermal isolation structures are formed on the protective material.

A third embodiment of the present invention is shown in FIG. 8. The protective material 64 may be applied over the integrated circuitry 44 prior to forming the thermal isolation structures 36, as described in commonly assigned and related U.S. Patent application A Method for Dry Etching of Post-processing Interconnection Metal on Hybrid Integrated Circuits, Ser. No. 08/381,693 (TI case 18945), filed concurrently herewith. The protective material 64 may be a 1–3 μm thick layer of a protective oxide or nitride, for example, silicon dioxide or silicon nitride. The optical coating 32 may be corrugated, as shown. In this embodiment, the vias 38 extend through the protective material 64 and make the appropriate electrical contacts to the integrated circuitry 44, as shown in FIG. 8. Thermal isolation slots 62 are formed after hybridization. Damage to the underlying integrated circuit 44 is minimized or prevented in this embodiment by the use of the protective material 64.

Figure 9:
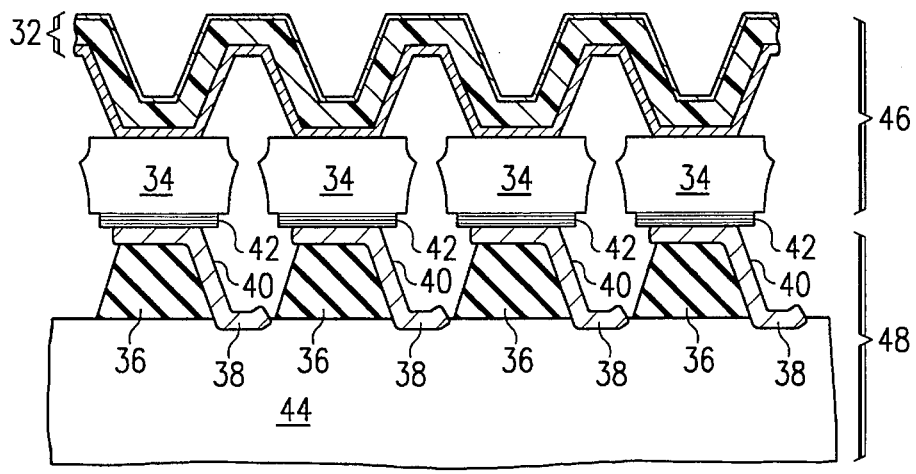
FIG. 9 shows a cross-sectional elevational view of a structure having a corrugated multilayer optical coating.
Figure 10:
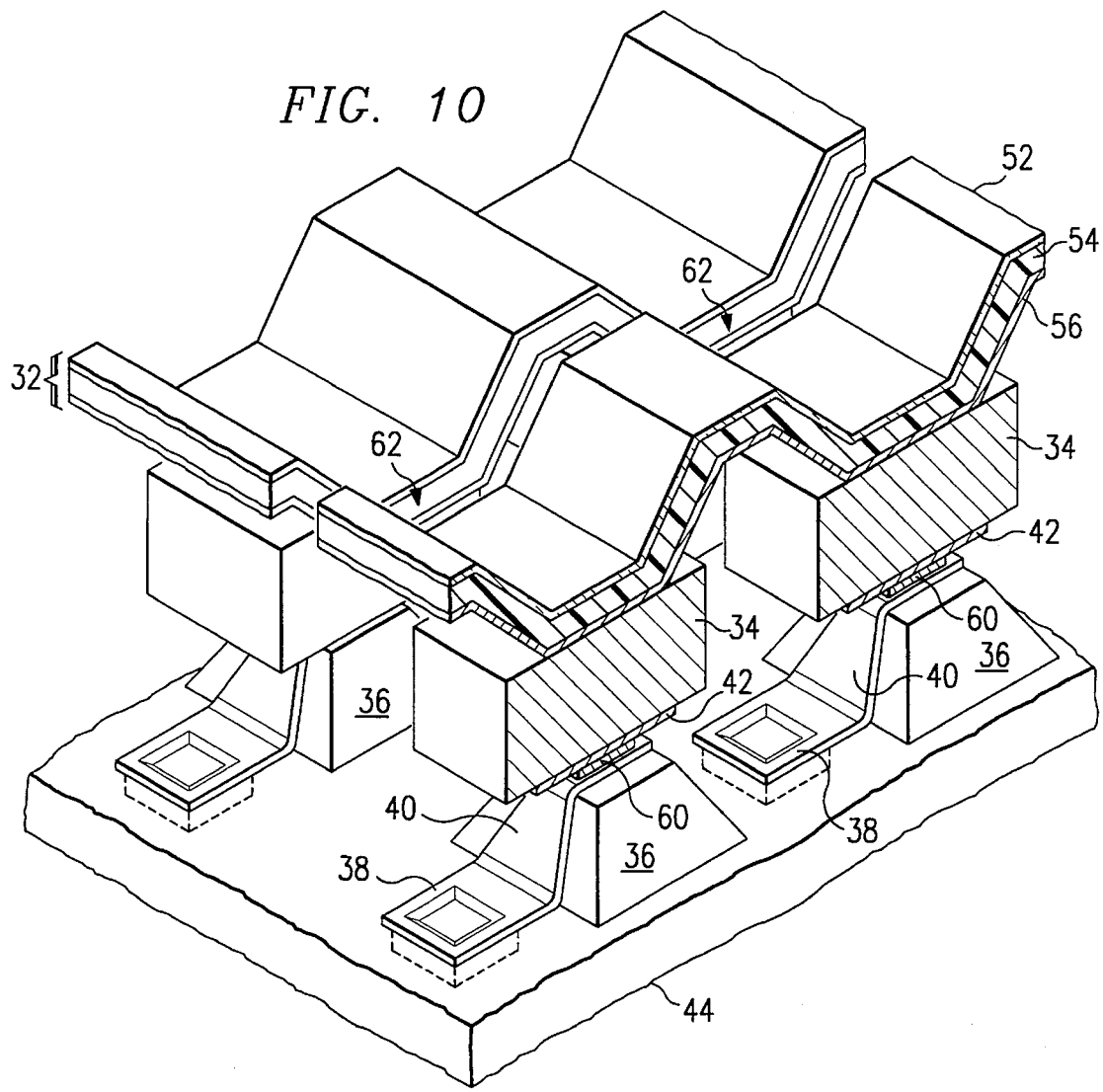
FIG. 10 shows an isometric view of the structure shown in FIG. 9 with elongated parallel thermal isolation slots etched in the corrugated optical coating.

There are many alternates to the hybrid structure illustrated. For example, the exact slot geometry need not be as sketched but may be a series of longer slots, elongated parallel slots as shown in FIG. 10, curved, s-shaped, serpentine or any other topology. Although the optical coating 32 is represented as a planar surface, this coating may contain elevations or corrugations for better thermal isolation as has been shown in the references and in FIGS. 8, 9 and 10. The protective material 64 may be an organic coating such as parylene, polymethylmethacrylate (PMMA), polyimide, photoresist, PIRL or combined layers thereof. The protective material 64 may also comprise other easily dissolved materials that will not affect or damage the hybrid device materials when applied or removed. Some thermal isolation slot 62 geometries may permit the use of wet solvents to remove the protective material 64.

The novel invention of reticulating the optical coat after attaching the infrared sensing array to the sensing integrated circuit structure (e.g., after hybridization) has advantages over prior art methods of reticulating the optical coat before hybridization. The optical coating is thin and fragile, and when attached solely to the pixels 34 may be easily broken. Etching the optical coat after hybridization minimizes breakage since the optical coating is a continuous film and thus provides more mechanical support during bonding. There is less chance for the optical coating to twist or bend, resulting in cracks of the optical coating or detached or misaligned pixels. The protective material in the second and third embodiments is a further advantage in that the sensing integrated circuit structure is chemically and mechanically protected by the protective material. This is particularly advantageous during the formation of slots in the optical coating.

While the invention has been described with reference to illustrative embodiments, this description is not intended to be construed in a limiting sense. Various modifications and combinations of the illustrative embodiments, as well as other embodiments of the inventions, will be apparent of persons skilled in the art upon reference to the description. It is therefore intended that the appended claims encompass any such modifications or embodiments.

What is claimed is:

1. A method for fabricating a hybrid thermal detector structure, comprising the steps of:

forming an infrared sensing array comprising at least three thermally sensitive pixels, backside contacts abutting a first side of said pixels, and an optical coating in contact with a second side of said pixels, wherein said optical coating is comprised of an electrically-conducting coat;

forming a sensing integrated circuit structure comprised of integrated circuitry, a thermal isolation structure mounted on said integrated circuitry, and contact metal electrically connecting said integrated circuitry to a top region of said thermal isolation structure;

coupling said backside contacts of said infrared sensing array to said contact metal of said sensing integrated circuit structure; and etching said optical coating of said infrared sensing array to form thermal isolation slots in said optical coating, wherein said etching step is performed after said coupling step.

2. The method of claim 1 wherein each pixel comprises a pyroelectric element formed from barium strontium titanate and wherein said electrically-conducting coat is coupled to one side of said pyroelectric element and a sensor signal electrode is coupled to the opposite side of said pyroelectric element.

3. The method of claim 1 wherein said electrically-conducting coat comprises cermet having a metal concentration by weight of seventy percent to ninety percent and a corresponding ceramic concentration by weight of thirty percent to ten percent.

4. The method of claim 1 wherein said optical coating is multilayered.

5. The method of claim 1 wherein said optical coating is corrugated.

6. The method of claim 1 wherein said thermal isolation structure is a mesa.

7. The method of claim 1 wherein said sensing integrated circuit structure further comprises a protective material deposited over at least said integrated circuitry.

8. The method of claim 7 wherein said protective material is also deposited over at least a portion of said thermal isolation structure.

9. The method of claim 7 wherein said protective material is deposited over said integrated circuitry, and said thermal isolation structure is mounted on said protective material.

10. The method of claim 1 wherein said slots are parallel.

11. The method of claim 10 wherein said electrically-conducting coat is connected at least at one end.

12. The method of claim 11 wherein said electrically-conducting coat is connected at both ends.

13. A method for fabricating a hybrid thermal detector structure, comprising the steps of:

forming an infrared sensing array comprising at least three thermally sensitive pixels, backside contacts abutting one side of said pixels, and an optical coating in contact with an opposite side of said pixels, wherein said optical coating is comprised of an electrically-conducting coat;

forming a sensing integrated circuit structure comprised of integrated circuitry, a thermal isolation structure mounted on said integrated circuitry, contact metal electrically connecting said integrated circuitry to a top region of said thermal isolation structure, and a protective coating deposited over at least said integrated circuitry;

coupling said backside contacts of said infrared sensing array to said contact metal of said sensing integrated circuit structure; and etching said optical coating of said infrared sensing array to form thermal isolation slots in said optical coating, wherein said etching step is performed after said coupling step.

14. The method of claim 13 wherein each pixel comprises a pyroelectric element formed from barium strontium titanate and wherein said electrically-conducting coat is coupled to one side of said pyroelectric element and a sensor signal electrode is coupled to the opposite side of said pyroelectric element.

15. The method of claim 13 wherein said electrically-conducting coat comprises cermet having a metal concentration by weight of seventy percent to ninety percent and a corresponding ceramic concentration by weight of thirty percent to ten percent.

16. The method of claim 13 wherein said optical coating is multilayered.

17. The method of claim 13 wherein said optical coating is corrugated.

18. The method of claim 13 wherein said thermal isolation structure is a mesa.

19. The method of claim 13 wherein said slots are parallel.

20. The method of claim 19 wherein said electrically-conducting coat is connected at least at one end.

21. The method of claim 20 wherein said electrically-conducting coat is connected at both ends.

22. The method of claim 13 wherein said protective material is deposited over at least a portion of said thermal isolation structure.

23. The method of claim 13 wherein said protective material is deposited over said integrated circuitry, and said thermal isolation structure is mounted on said protective material.

* * * * *